(12) United States Patent
Chen

(10) Patent No.: US 9,191,003 B2
(45) Date of Patent: Nov. 17, 2015

(54) INTEGRATED CIRCUIT FOR MEMORY AND OPERATING METHOD THEREOF

(71) Applicant: MACRONIX INTERNATIONAL CO., LTD., Hsinchu (TW)

(72) Inventor: Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/071,790

(22) Filed: Nov. 5, 2013

(65) Prior Publication Data

US 2015/0123708 A1    May 7, 2015

(51) Int. Cl.
  *H03K 19/017*    (2006.01)
  *H03K 19/00*    (2006.01)
  *H03K 19/0175*    (2006.01)

(52) U.S. Cl.
  CPC .... *H03K 19/017509* (2013.01); *H03K 19/0005* (2013.01); *H03K 19/017* (2013.01)

(58) Field of Classification Search
  CPC ............... H03K 19/08521; H03K 19/356113; H03K 19/018528; H03K 19/00315
  USPC ................. 326/63, 62, 83; 327/333
  See application file for complete search history.

(56) References Cited

U.S. PATENT DOCUMENTS

| | | | | |
|---|---|---|---|---|
| 6,335,881 | B2* | 1/2002 | Kim et al. | 365/185.18 |
| 7,663,922 | B2* | 2/2010 | Park et al. | 365/185.17 |
| 8,593,686 | B2* | 11/2013 | Kanemoto | 358/1.9 |
| 8,780,644 | B2* | 7/2014 | Cho | 365/189.05 |
| 2003/0072175 | A1* | 4/2003 | Kawamura | 365/185.17 |
| 2003/0210576 | A1* | 11/2003 | Hwang et al. | 365/189.05 |
| 2005/0213378 | A1* | 9/2005 | Chang | 365/185.03 |
| 2007/0242512 | A1 | 10/2007 | Park et al. | |
| 2012/0268996 | A1 | 10/2012 | Park | |

OTHER PUBLICATIONS

Tw Office Action dated Jul. 17, 2015 in corresponding Taiwan application (No. 102139005).

* cited by examiner

*Primary Examiner* — Dylan White
(74) *Attorney, Agent, or Firm* — McClure, Qualey & Rodack, LLP

(57) ABSTRACT

An integrated circuit of a memory is provided. The integrated circuit comprises a first data driving circuit and a transmitting transistor. The first data driving circuit outputs a first data voltage to a first node. The transmitting transistor is coupled between the first node and a second node. When the transmitting transistor receives a bias voltage and the voltage level of the first node is a first voltage level, the transmitting transistor makes the voltage level of the second node to be set as a third voltage level, third voltage level is close to or substantially equal to the first voltage level. When the transmitting transistor receives the bias voltage and the voltage level of the first node is the second voltage level, the voltage level of the second node is independently of the voltage level of the first node.

18 Claims, 15 Drawing Sheets

INTEGRATED CIRCUIT FOR MEMORY AND OPERATING METHOD THEREOF

BACKGROUND OF THE INVENTION

1. Field of the Invention

The invention relates in general to an integrated circuit and an operating method thereof, and more particularly to an integrated circuit for a memory and an operating method thereof.

2. Description of the Related Art

With the development of technology, non-volatile memories are widely applied in a variety of electronic products. For example, NAND flash memory is one of the most used non-volatile memories. Integrated circuit such as a page buffer is usually used to perform a read operation, a program operation, a program verify operation and an erase operation for the memory cell of the flash memory. However, traditional page buffer usually needs to perform a large number of steps to complete the above operations. Accordingly, the access speed of the memory significantly decreased.

Therefore, there is a need for an integrated circuit capable of effectively increasing the access speed for the memory.

SUMMARY OF THE INVENTION

The invention is directed to an integrated circuit for a memory. The integrated circuit significantly simplifies the steps required in the program verify operation with a combination of a data driving circuit and a transistor receiving a specific bias voltage.

According to an aspect of the e present invention, an integrated circuit of a memory is provided. The integrated circuit comprises a first data driving circuit and a transmitting transistor. The first data driving circuit, coupled to a first node, is for outputting a first data voltage to the first node. The voltage level of the first node comprises a first voltage level and a second voltage level. The transmitting transistor is coupled between the first node and a second node. The voltage level of the second node is a third voltage level or a fourth voltage level. When the transmitting transistor receives a bias voltage and the voltage level of the first node is the first voltage level, the transmitting transistor makes the voltage level of the second node to be set as the third voltage level, third voltage level is close to or substantially equal to the first voltage level. When the transmitting transistor receives the bias voltage and the voltage level of the first node is the second voltage level, the voltage level of the second node is independently of the voltage level of the first node.

According to another aspect of the present invention, an integrated circuit of a memory is provided. The integrated circuit comprises a first data driving circuit and a transmitting transistor. The first data driving circuit, coupled to a first node, for outputting a first data voltage to the first node, wherein the logic level of the first node comprises a first logic level and a second logic level. The transmitting transistor coupled between the first node and a second node, wherein a voltage level of the second node is a third logic level or a fourth logic level. When the transmitting transistor receives a bias voltage and the logic level of the first node is the first logic level, the transmitting transistor makes the logic level of the second node to be set as the third logic level, the third logic level is equal to the first logic level, when the transmitting transistor receives the bias voltage and the logic level of the first node is the second logic level, the logic level of the second node is independently of the logic level of the first node.

According to another aspect of the present invention, an operating method of an integrated circuit is provided. The operating method comprises the following steps. First, providing an integrated circuit. The integrated circuit comprises a first data driving circuit and a transmitting transistor. The first data driving circuit, coupled to a first node, is for outputting a first data voltage to the first node. The voltage level of the first node includes a first voltage level and a second voltage level. The transmitting transistor is coupled between the first node and a second node. A voltage level of the second node is a third voltage level or a fourth voltage level. Then, when the transmitting transistor receives a bias voltage and the voltage level of the first node is the first voltage level, setting the voltage level of the second node to be the third voltage level by the transmitting transistor. When the transmitting transistor receives the bias voltage and the voltage level of the first node is the second voltage level, making the voltage level of the second node to be independently of the voltage level of the first node.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
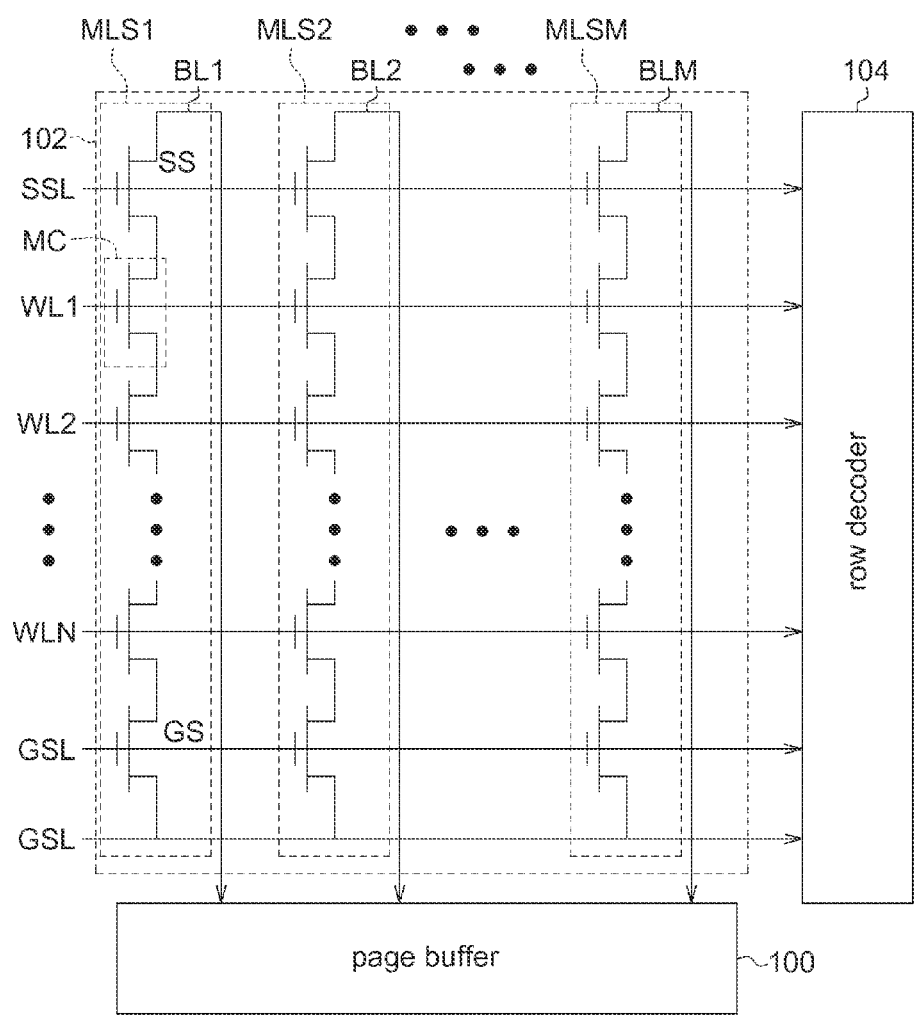
FIG. 1 shows a schematic diagram of an integrated circuit of memory, a memory cell array and a row decoder according to an embodiment of the invention.

FIG. 1 shows a schematic diagram of an integrated circuit 100 of the memory, a memory cell array 102 and a row decoder 104 according to an embodiment of the invention. As shown in FIG. 1, the integrated circuit 100 and the row decoder 104 are connected to the memory cell array 102 through the bit lines BL1-BLM and word lines WL1-WLN, respectively, where M and N are positive integers. The memory cell array 102 includes a number of memory cell strings MCS1-MCSM. The memory cell strings MCS1-MCSM have substantially the same structure. Taking the memory cell string MCS1 for example, the memory cell string MCS1 includes a number of memory cells MC, a row selection switch SS and a ground selection switch GS. The memory cells MC are connected to a corresponding bit line (for example, bit line BL1) in series and coupled to the common source line CSL through the ground selection switch GS. When a memory cell MC (regarded as a target memory cell) is to be read or programmed, the row decoder 104 controls the selection switch SS via the selection line SS to couple the target memory cell MC to a corresponding bit line. Then, the integrated circuit 100 performs a read operation or a program operation for the target memory cell MC through the corresponding bit line. The memory cell MC described above may be, for example, a multi-level cell (MLC). The MLC may be implemented by an oxide-semiconductor field-effect transistor having programmable threshold voltage. The present invention is not limited to the above examples. The memory cell MC may also be a single level cell (SLC).

Figure 2:
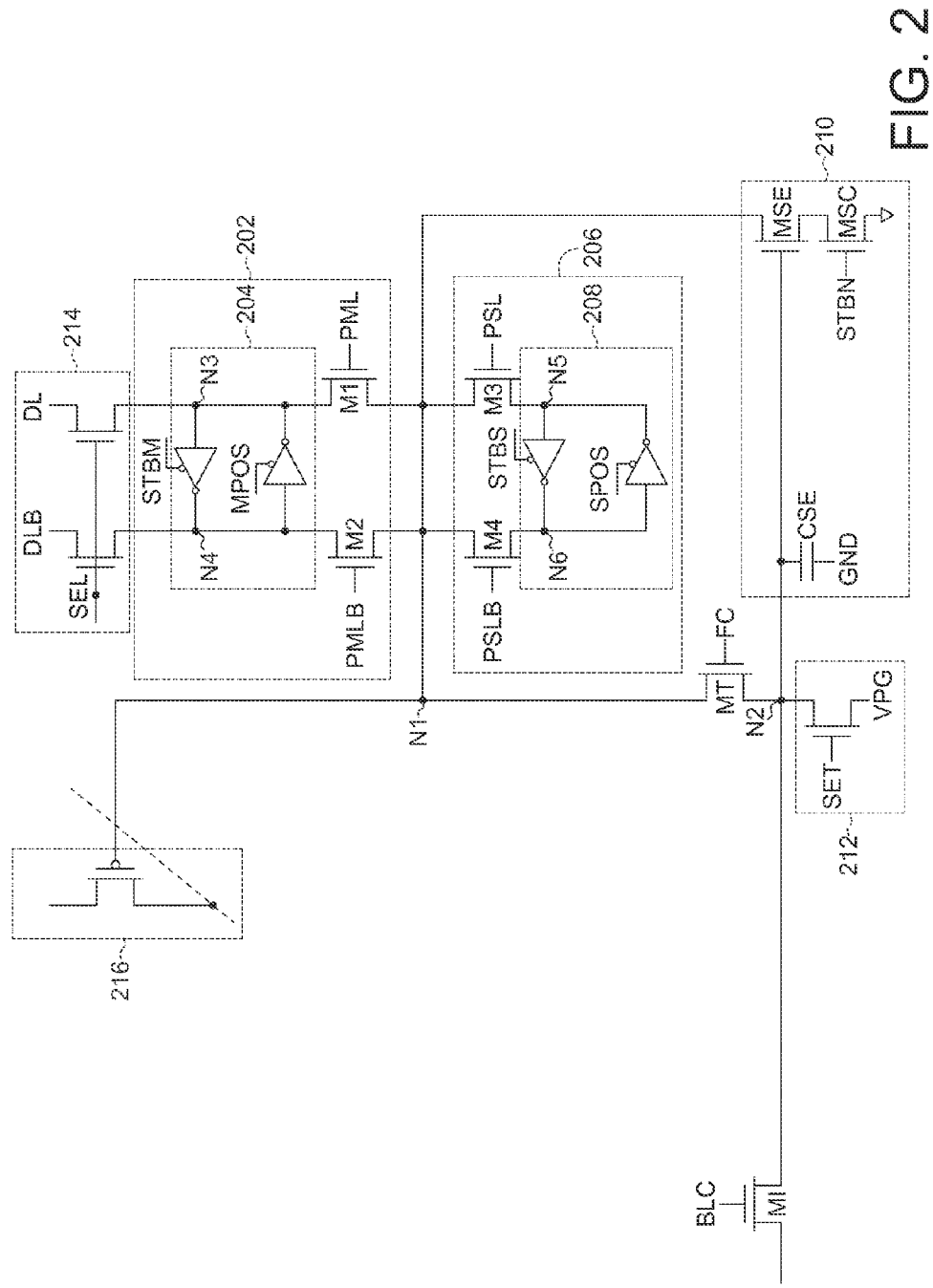
FIG. 2 shows a circuit diagram of the integrated circuit according to an embodiment of the invention.

Referring to FIG. 2, a circuit diagram of the integrated circuit 200 according to an embodiment of the invention is shown. The integrated circuit 200 includes a first data driving circuit 202 and a transmitting transistor MT. The first data driving circuit 202, coupled to a first node N1, is for outputting a first data voltage to the first node N1. The voltage level of the first node N1 includes a first voltage level and a second voltage level. The transmitting transistor MT, coupled between the first node N1 and a second node N2, is controlled by transmitting control signal FC. A voltage level of the second node N2 is a third voltage level or a fourth voltage level. For example, the first voltage level and the third voltage level are low voltage level representing digital logic "0", and the second voltage level and the fourth voltage level are high voltage level representing digital logic "1" The transmitting transistor MT may be, for example, an N-type oxide-semiconductor field-effect transistor. The present invention is not limited to the above example. The transmitting transistor MT may be implemented by a P-type oxide-semiconductor field-effect transistor.

In the present embodiment, the first data driving circuit 202 includes a first latch 204, a first transistor M1 and a second transistor M2. The first latch 204 is used for storing the first data voltage in a third node N3, and storing an inverse first data voltage in a fourth node N4. As shown in FIG. 2, the first latch 204 may be, for example, implemented by two tri-state inverters connected to each other. These two tri-state inverters are controlled by signal STBM and signal MPOS, respectively.

The first transistor M1 has a first terminal, a second terminal and a third terminal receiving a first control signal PML. The first terminal of the first transistor M1 and the second terminal of the first transistor M1 are coupled to the third node N3 and the first node N1, respectively. When the first control signal PML is enabled, the first data voltage stored in the third node N3 is outputted to the first node N1. For example, assuming that the first data voltage stored in the third node N3 is 0 volt (corresponding to digital value "0"), when the first control signal PML is enabled, the first transistor M1 is turned on and the first data voltage is outputted to the first node N1, so that the voltage level of the first node N1 is set to be close to or substantially equal to 0 volt (assume that the voltage difference between the first terminal (drain) and the second terminal (source) of the first transistor M1 is ignored when the first transistor M1 is turned on).

Similarly, the second transistor M2 has a first terminal, a second terminal and a third terminal receiving a second control signal PMLB. The first terminal of the second transistor M2 and the second terminal of the second transistor M2 are coupled to the fourth node N4 and the first node N1, respectively. When the second control signal PMLB is enabled, the inverse first data voltage stored in the fourth node N4 is outputted to the first node N1. Taking the first data voltage corresponding to the digital value "0" for example, the inverse first data voltage is corresponding to the digital value "1." The first transistor M1 and the second transistor M2 described above may be, for example, N-type oxide-semiconductor field-effect transistors. The present invention is not limited to the above example. The first transistor M1 and the second transistor M2 may be implemented by P-type oxide-semiconductor field-effect transistors.

The integrated circuit 200 may further includes a second data driving circuit 206. The second data driving circuit 206 is coupled to the first node N1, and used for outputting a second data voltage to the first node N1. In the present embodiment, the second data driving circuit 206 has substantially the same structure as the first data driving circuit 202. The present invention is not limited to the above example. The second data driving circuit 206 may also be implemented by other types of latch circuits. As shown in FIG. 2, the second data driving circuit 206 includes a second latch 208, a third transistor M3 and a fourth transistor M4. The second latch 208 is used for storing the second data voltage in a fifth node N5, and storing an inverse second data voltage in a sixth node N6. The second latch 208 may be, for example, implemented by two tristate inverters connected to each other. These two tri-state inverters are controlled by signal STBS and signal SPOS, respectively.

The third transistor M3 has a first terminal, a second terminal and a third terminal receiving a third control signal PSL. The first terminal and the second terminal of the third transistor M3 are coupled to the fifth node N5 and the first node N1, respectively. When the third control signal PSL is enabled, the second data voltage stored in the fifth node N5 is outputted to the first node N1.

Similarly, the fourth transistor M4 has a first terminal, a second terminal and a third terminal receiving a fourth control signal PSLB. The first terminal and the second terminal of the fourth transistor M4 are coupled to the sixth node N6 and the first node N1, respectively. When the fourth control signal PSLB is enabled, the inverse second data voltage stored in the sixth node N6 is outputted to the first node N1, The third transistor M3 and the fourth transistor M4 described above may be, for example, N-type oxide-semiconductor field-effect transistors. The present invention is not limited to the above example. The third transistor M3 and the fourth transistor M4 may be implemented by P-type oxide-semiconductor field-effect transistors.

The integrated circuit 200 may further includes a sensing circuit 210. The sensing circuit 210 is controlled by the voltage level of the second node N2 and coupled to the second node N2. When the voltage level of the second node N2 is the fourth voltage level (high voltage level), the sensing circuit 210 generates a discharging current path, so that the voltage level of the first node N1 is set to be the first voltage level. When the voltage level of the second node N2 is the third voltage level (low voltage level), the sensing circuit 210 interrupts the discharging current path. For example, when the voltage level of the second node N2 is the high voltage level (for example, the fourth voltage level) and the sensing control signal STBN is enabled to turn on the sensing control transistor MSC, because the gate of the sensing transistor MSE is coupled to the second node N2, the sensing transistor MSE is turned on and a current is generated between the drain and the source of the sensing transistor MSE to form the discharging current path. Accordingly, the voltage level of the first node N1 is set to be the low voltage level (for example, the first voltage level). On the contrary, when the voltage level of the second node N2 is the low voltage level (for example, the third voltage level), the sensing transistor MSE is turned off, and the sensing circuit 210 interrupts the discharging current path.

The sensing circuit 210 may further include a sensing capacitor CSE. One terminal of the sensing capacitor CSE is coupled to the second node N2, and the other terminal receives a ground voltage (CND). The second node N2 is coupled to a bit line corresponding to the target memory cell MC. Accordingly, when the sensing capacitor CSE is charged or discharged through the corresponding bit line, the voltage level of the second node N2 is changed. Thus, the sensing circuit 210 is capable of sensing the data stored in the target memory cell MC according to the voltage level of the second node N2.

In the present embodiment, the integrated circuit 200 further includes a pre-charging and setting circuit 212, a data control circuit 214 and an erase circuit 216. The pre-charging and setting circuit 212, controlled by an initializing control signal SET, is used for initializing the first data voltage and the second data voltage stored in the first data driving circuit 202 and the second data driving circuit 206, and for pre-charging the second node N2. The data control circuit 214, controlled by a data control signal SEL, is used for outputting data voltages DL and DLB to the first data driving circuit 202, and makes the data voltages DL and DLB to be taken as the first data voltage and the inverse data voltage, respectively. The erase circuit 216, controlled by the voltage level of the first node N1, is used for perform the erase operation for the memory cell MC.

On the other hand, the integrated circuit 200 further includes an isolating transistor MI. The isolating transistor MI has a first terminal, a second terminal, and a third terminal receiving an isolating control signal BLC. The first terminal of the isolating transistor MI is coupled to the bit line connected to the memory cell MC, and the second terminal of the isolating transistor MI is coupled to the second node N2. When the isolating control signal is enabled to turn on the isolating transistor MI, the second node N2 is coupled to the bit line connected to the memory cell MC.

Figure 3:
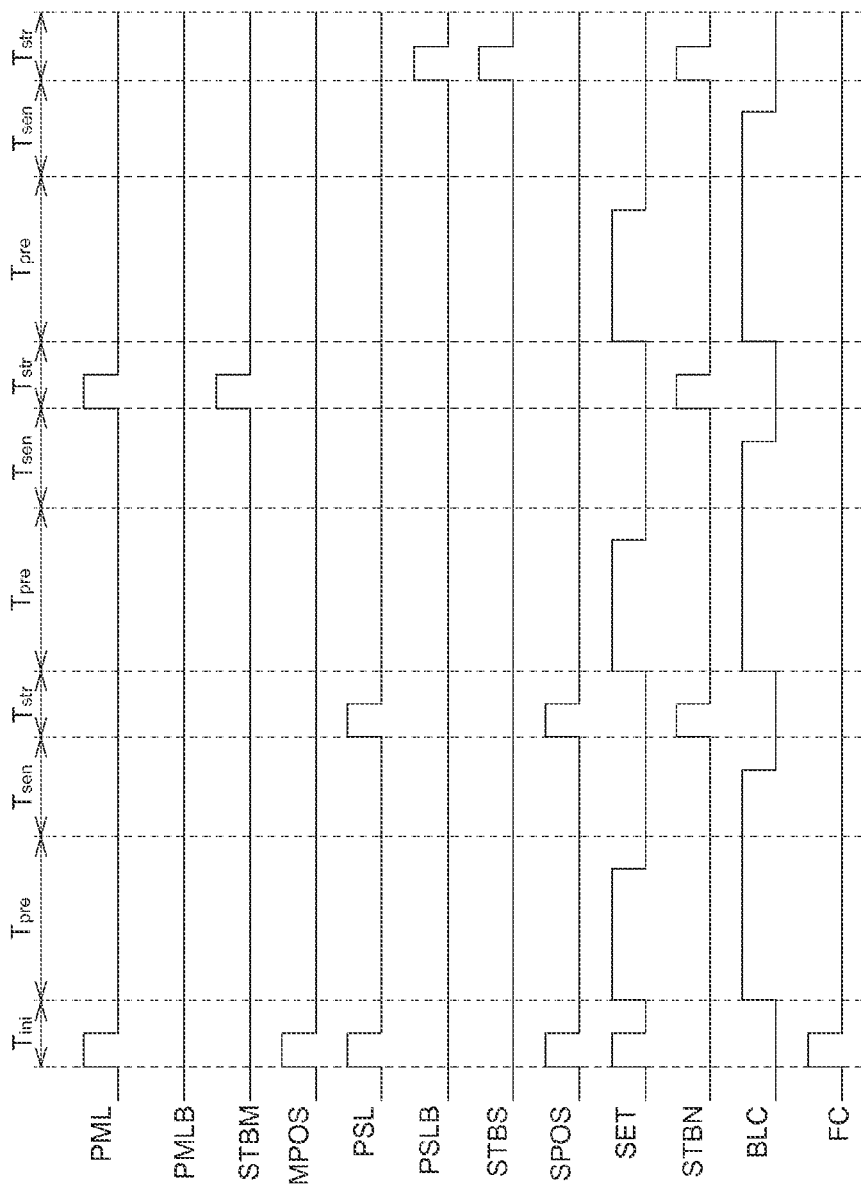
FIG. 3 shows a signal waveform diagram when the integrated circuit performs the read operation.

For better illustrations, descriptions of different operations of the integrated circuit 200 are given below.
Read Operation FIG. 3 shows a signal waveform diagram when the integrated circuit 200 performs the read operation. As seen from FIG. 3, the read operation of the integrated circuit 200 includes an initializing time period Tini, a pre-charging time period Tpre, a sensing time period Tsen and a reading time period Tstr.

Figure 4:
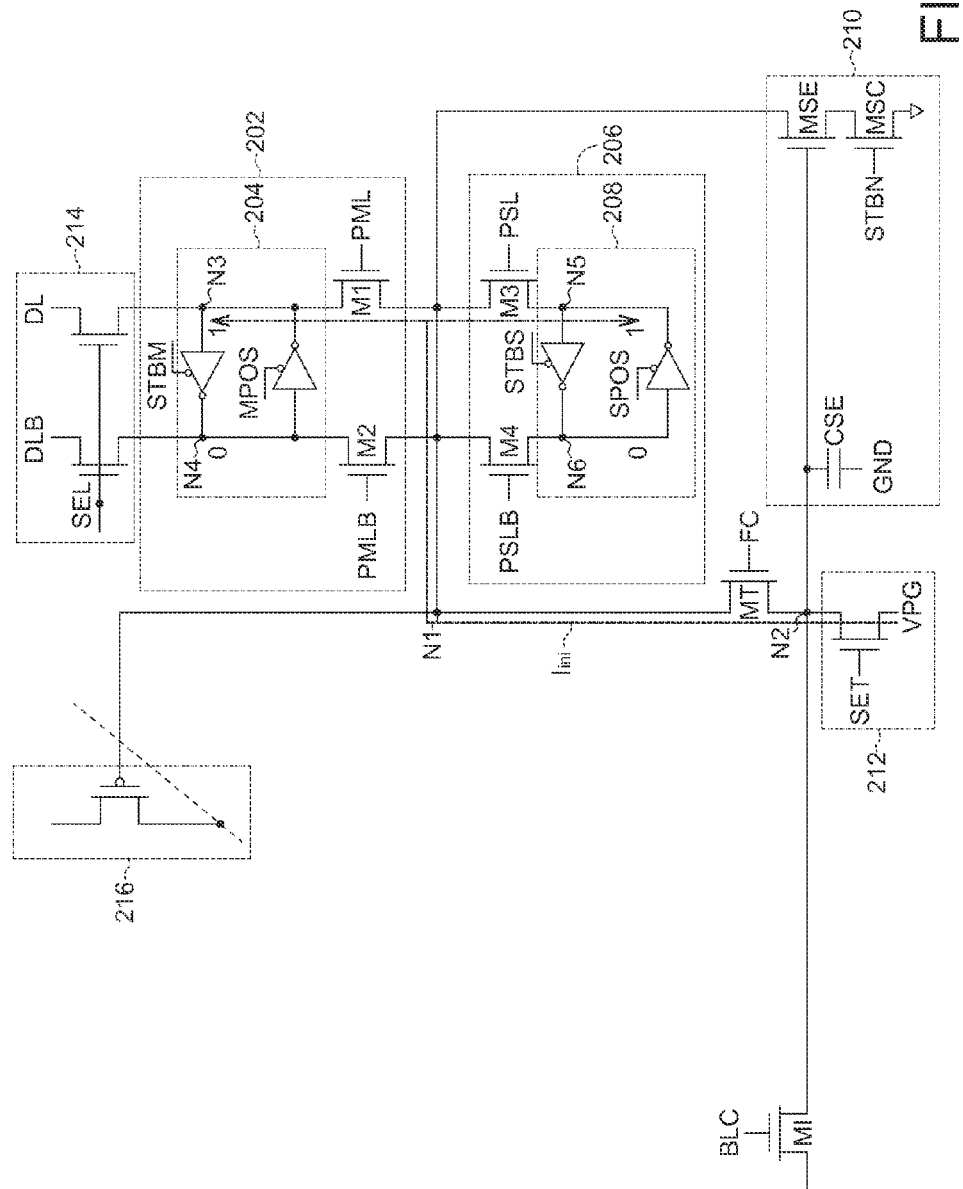
FIG. 4 shows a current in the integrated circuit during the initializing time period.

Referring to FIG. 4, a current in the integrated circuit 200 during the initializing time period Tini is shown. During the time period Tini, the pre-charging and setting circuit 212 sets the first data voltage stored in the third node N3 and the second data voltage stored in the fifth node N5 to a voltage level corresponding to a digital value "1" through a resetting current path Iini. Besides, with the operation of the tri-state inverter, the fourth node N4 and the sixth node N6 respectively have a voltage level corresponding to a digital value "0."

Figure 5:
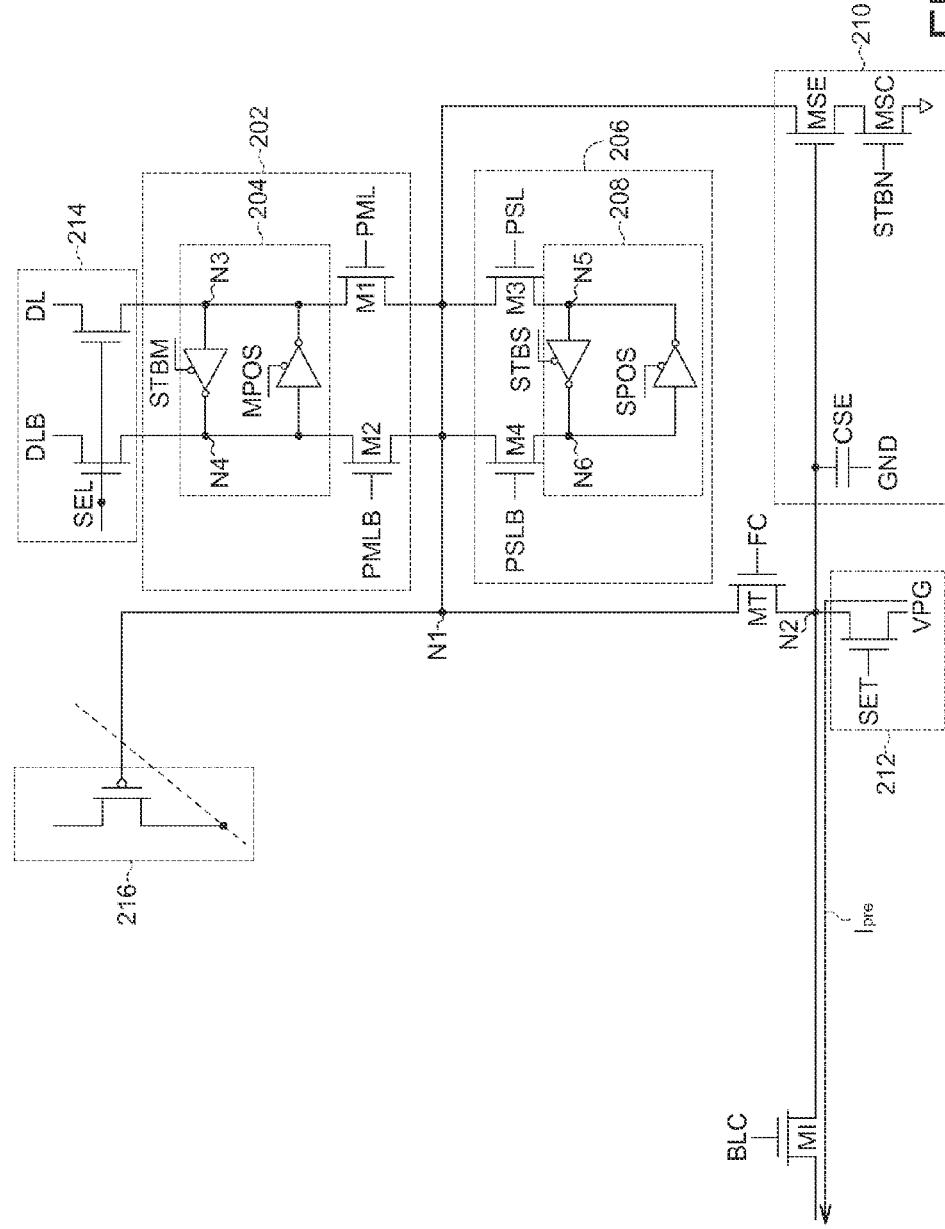
FIG. 5 shows a current of the integrated circuit during the pre-charging time period.

Then, referring to FIG. 5, a current of the integrated circuit 200 during the pre-charging time period Tpre is shown. During the time period Tpre, the pre-charging and setting circuit 212 pre-charges the bit line through a pre-charging current path Ipre, so that the voltage level of the bit line (or the voltage level of the second node N2) is set to the voltage level which is appropriate to sense the memory cell MC, such as the fourth voltage level (high voltage level).

Figure 6:
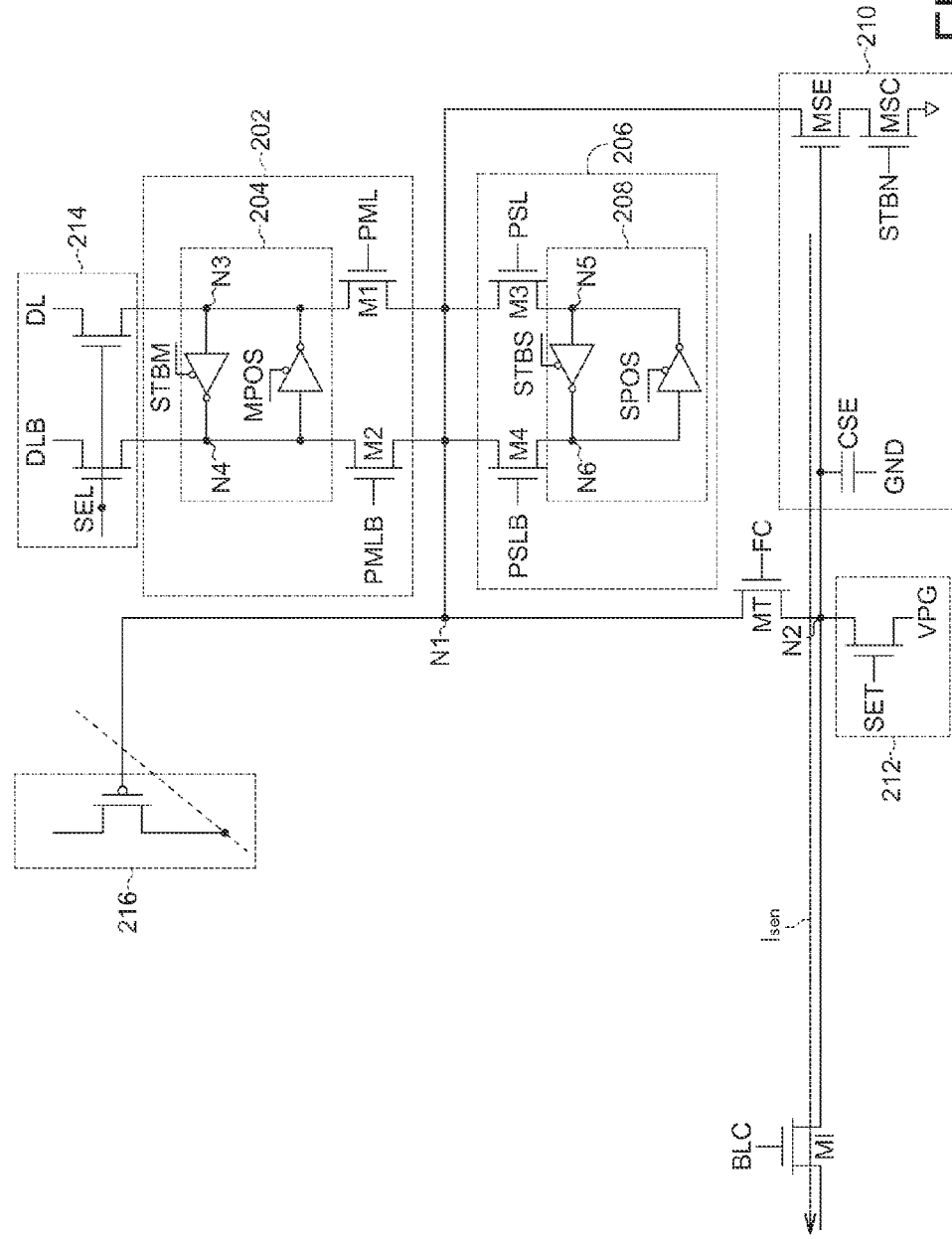
FIG. 6 shows a current of the integrated circuit during the sensing time period Tsen.

Next, referring to FIG. 6, a current of the integrated circuit 200 during the sensing time period Tsen is shown. During the time period Tsen, the sensing circuit 210 senses the target memory cell MC through a sensing current path Isen. Generally, the target memory cell MC has a memory cell threshold voltage. The value of the memory cell threshold voltage is corresponding to the data stored in the target memory cell MC.

Figure 7:
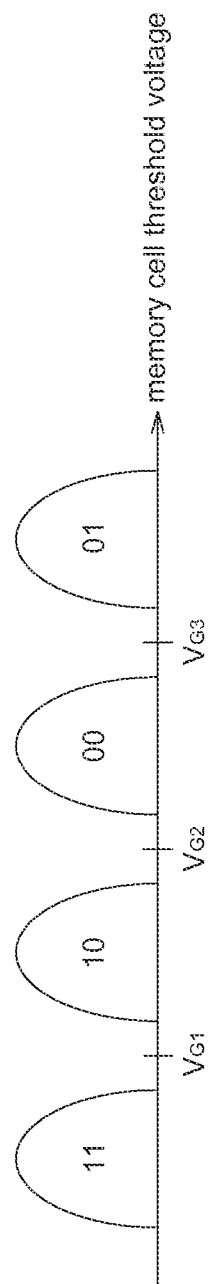
FIG. 7 shows the relation between the memory cell threshold voltage and the corresponding data.

Referring to FIG. 7, the relation between the memory cell threshold voltage and the corresponding data is shown. As shown in FIG. 7, four voltage intervals of the memory cell threshold voltage of 2-bit MLC is shown. These voltage intervals are corresponding to 2 bit data "11," "10," "00" and "01," " respectively. The present invention is not limited to the above examples. The bit data corresponding to the memory cell threshold voltage can be defined according to different applications.

The gate of the target memory cell MC receives a reading voltage (for example, the voltage VG1, VG2 or VG3 in FIG. 7). When the reading voltage is greater than the memory cell threshold voltage, a sensing current is generated and flows through the target memory cell MC to discharge the second node N2, so that the voltage level of the second node N2 becomes the low voltage level (for example, the third voltage level). On the contrary, when the reading voltage is less than the memory cell threshold voltage, the sensing current is not generated in the target memory cell MC, so that the voltage level of the second node N2 is maintained at a pre-charged high voltage level, such as the fourth voltage level. For example, assuming that the reading voltage is voltage VG2 and the memory cell threshold voltage is corresponding to bit data "10". Since the reading voltage is greater than the memory cell threshold voltage, a sensing current is generated and flows through the target memory cell MC to discharge the second node N2, so that the voltage level of the second node N2 becomes the low voltage level.

Figure 8:
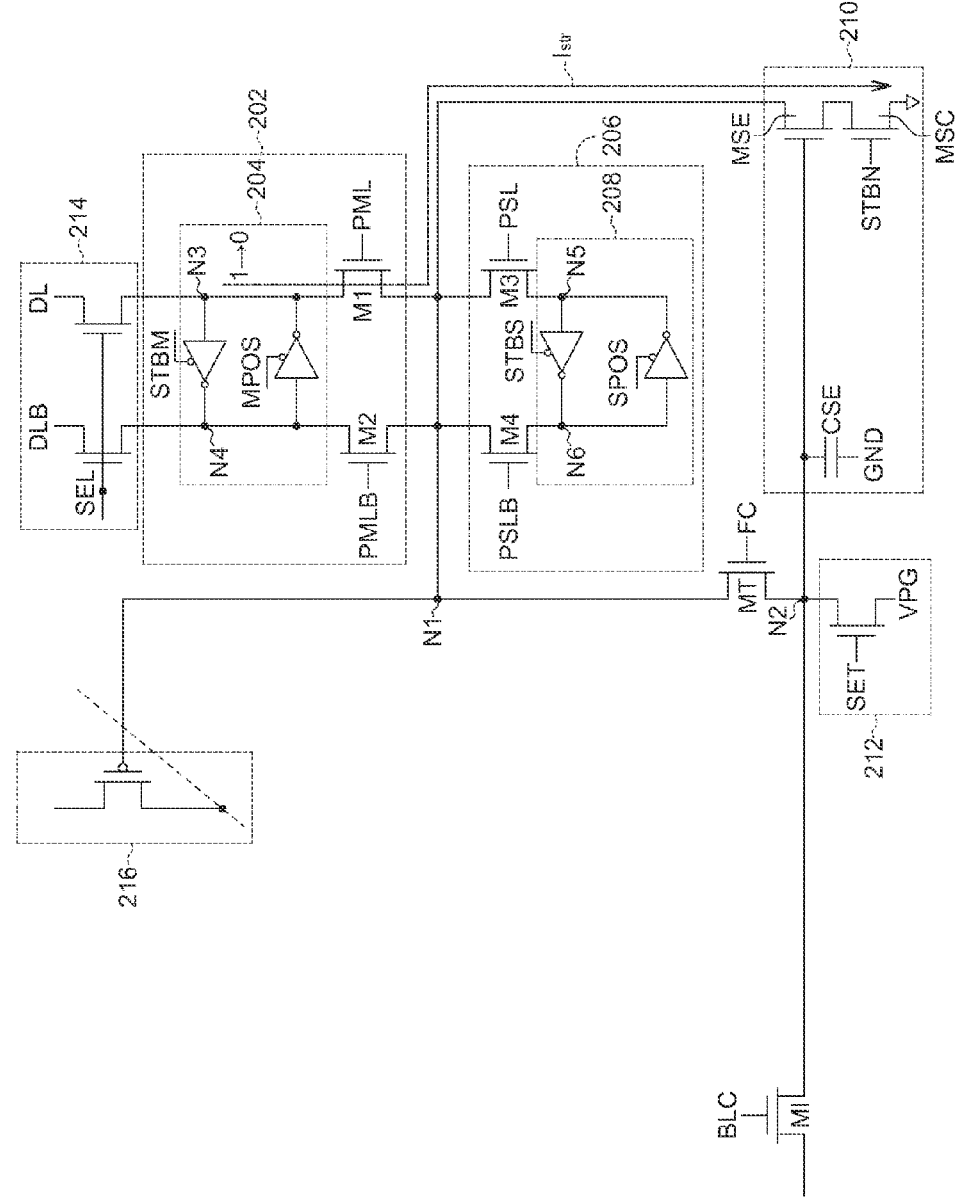
FIG. 8 shows a current schematic diagram of an example of the integrated circuit during the reading time period.

Referring to FIG. 8, a current schematic diagram of an example of the integrated circuit 200 during the reading time period Tstr is shown. In this example, assuming that the reading voltage is voltage VG2 (i.e. the reading voltage is between the memory cell threshold voltages corresponding to the bit data "10" and the bit data "00") and the memory cell threshold voltage (corresponding to the bit data "00" or the bit data "01", for example, and the most significant bit (MSB) of these bit data "00" and "01" is "0") is greater than the voltage VG2, the voltage level of the second node N2 maintains at a pre-charged high voltage level (for example, the fourth voltage level corresponding to the digital value "1"). At this time, the sensing transistor MSE is turned on to discharge the third node N3 through a reading current path Istr, so that the first data voltage is changed to the voltage level corresponding to the digital value "0" from the voltage level corresponding to the digital value "1". Accordingly, the most significant bit (MSB) of the 2-bit data can be stored in the first data driving circuit 202. In other words, since the MSB of the bit data corresponding to the memory cell threshold voltages smaller than VG2 is both "1" and the MSB of the bit data corresponding to the memory cell threshold voltages larger than VG2 is both "0", the reading voltage of voltage VG2 can be used to read the MSB of the 2-bit data stored in the target memory cell MC.

Similarly, reading the target memory cell MC by the reading voltages of voltage VG1 and voltage VG3 can obtain the least significant bit (LSB) of the 2-bit data stored in the target memory cell MC. The LSB is stored in the second data driving circuit 206, for example.

Program and Program Verify Operations

Figure 9:
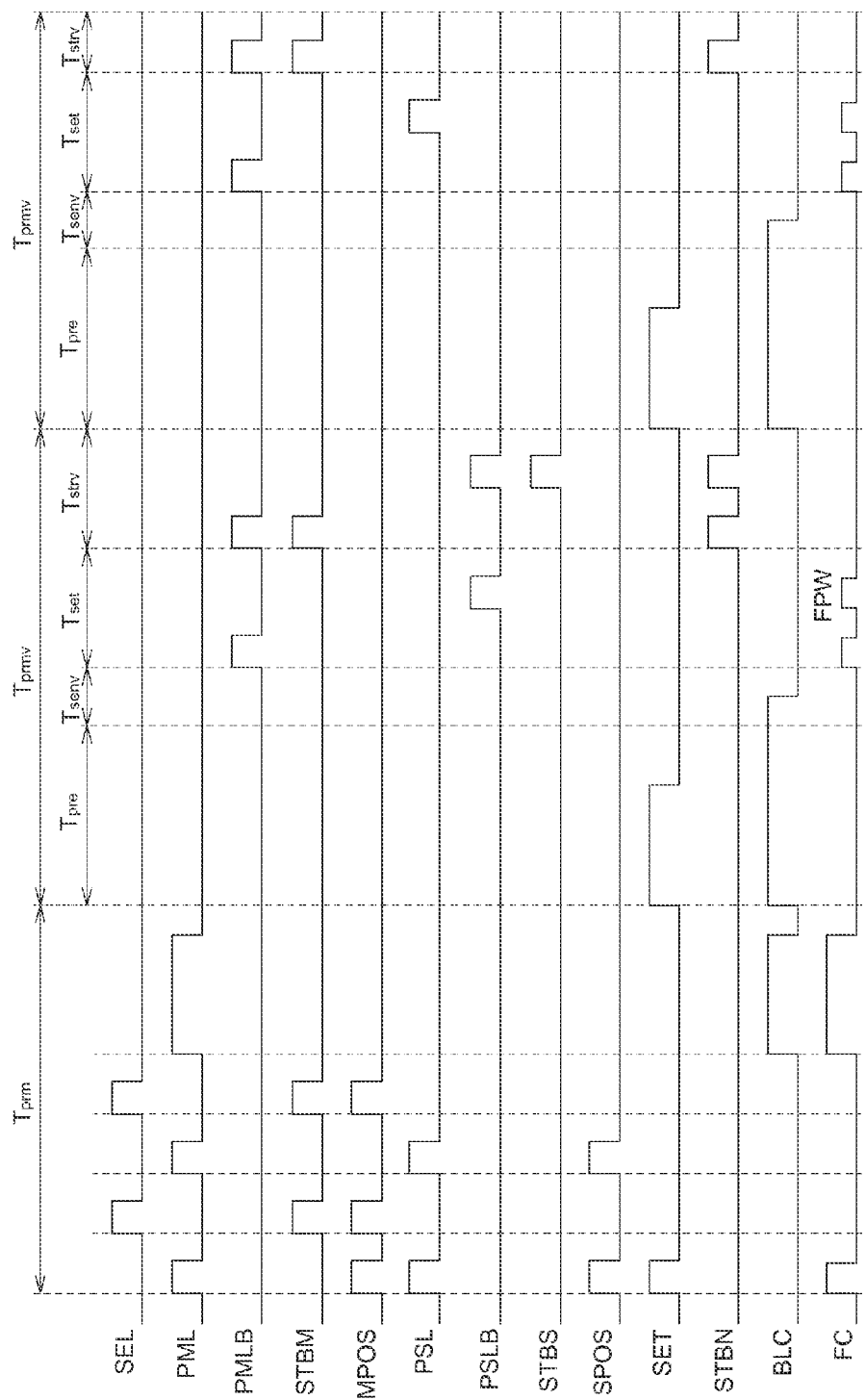
FIG. 9 shows a signal waveform diagram when the integrated circuit performs the program and program verify operations.

FIG. 9 shows a signal waveform diagram when the integrated circuit 200 performs the program and program verify operations. During the programming time period Tprm, the pre-charging and setting circuit 212 sets the voltage level of the third node N3 and the voltage level of the fifth node N5 to be a voltage level corresponding to the digital value "1." Then, the data control circuit 214 makes the data voltages DL and DLB to be stored in the first data driving circuit 202 and the second data driving circuit 206. For example, the data (D_DL, D_DLB) transmitted by the data voltages DL and DLB is (1, 1), (1, 0), (0, 0) or (0, 1). Next, the program operation of the target memory cell MC is performed according to the first data voltage and the second data voltage stored in the first data driving circuit 202 and the second data driving circuit 206, respectively, so that the data stored in the first data driving circuit 202 and the second data driving circuit 206 can be written in the target memory cell MC.

Figure 10:
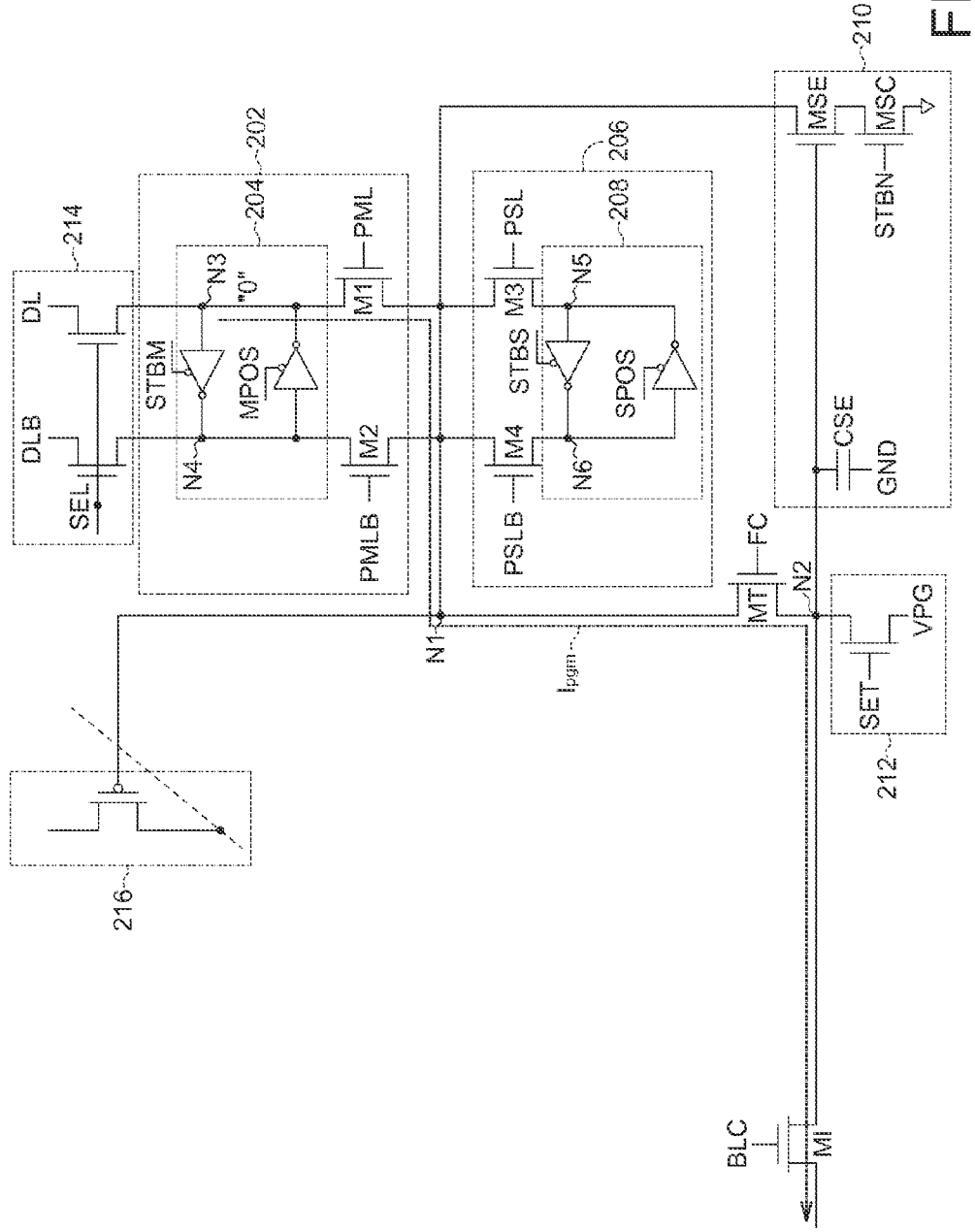
FIG. 10 shows an example of the program operation of the integrated circuit for the target memory cell.

Referring to FIG. 10, an example of the program operation of the integrated circuit 200 for the target memory cell MC is shown. Generally, if the data stored by the data voltage DL or DLB is "0," the corresponding target memory cell MC Will be programmed. In such situation, the first data driving circuit 202 or the second data driving circuit 206 which stores data "0" may, for example, output the data voltage corresponding to the digital value "0" to program the target memory cell MC. As shown is FIG. 10, a programming current path Ipgm flows out from the first data driving circuit 202, so that the target memory cell MC is programmed.

When the program operation is complete, the integrated circuit 200 then performs the program verify operation. The program verify operation is aim to check whether the data is correctly written into the target memory cell MC. Accordingly, the integrated circuit 200 verifies the data by reading the target memory cell MC. As shown in FIG. 9, the program verifying time period Tprmv includes a pre-charging time period Tpre, a sensing verifying time period Tsenv, a setting time period Tset and a reading verifying time period Tstrv.

During the pre-charging time period Tpre, the pre-charging and setting circuit 212 pre-charges the bit line through a pre-charging current path Ipre (similar to the pre-charging current path Ipre shown in FIG. 5), so that the voltage level of the bit line (or the voltage level of the second node N2) is set to be the voltage level appropriate to sense the memory cell MC, such as the high voltage level (fourth voltage level).

Figure 11:
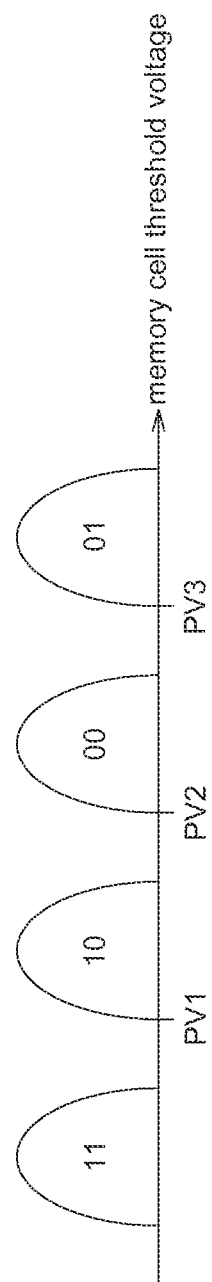
FIG. 11 shows the relation of the memory cell threshold voltage and the data to be verified.

Then, during the sensing verifying time period Tsenv, the gate of the target memory cell MC receives a verify voltage (for example the voltage PV1, PV2, or PV3 in FIG. 11). The verify voltage is used for verifying whether the target memory cell MC has been programmed to have the threshold voltage corresponding to the data to be stored.

Referring to FIG. 11, the relation of the memory cell threshold voltage and the data to be verified is shown. FIG. 11 shows four voltage intervals of the memory cell threshold voltage. These voltage intervals correspond to 2 bit data "11" "10", "00", and "01", respectively. In the present embodiment, the voltage PV1 corresponds to the minimum voltage of the memory cell threshold voltage interval corresponding to data "10," the voltage PV2 corresponds to the minimum voltage of the memory cell threshold voltage interval corresponding to data "00," and the voltage PV3 corresponds to the minimum voltage of the memory cell threshold voltage interval corresponding to data "01." In other words, when the verify voltage is the voltage PV1, the verify voltage (PV1) is used to verify whether the target memory cell MC has been programmed to a storing data "10". When the verify voltage is the voltage PV2, the verify voltage (PV2) is used to verify whether the target memory cell MC has been programmed to a storing data "00". When the verify voltage is the voltage PV3, the verify voltage (PV3) is used to verify whether the target memory cell MC has been programmed to a storing data "01".

In short, the verify voltage is corresponding to a verify data, and the verify data is the data which is intended to be programmed into to the memory cell MC and is needed to be verified whether the program operation succeeds. For example, as shown in FIG. 11, if the 2-bit data "10" is programmed into the target memory cell MC during the program operation, a verify voltage corresponding to the voltage PV1 is needed to be applied on the gate of the target memory cell MC to check whether the target memory cell MC has been programmed to the memory cell threshold voltage corresponding to the 2-bit data "10".

In the present embodiment, if the verify voltage is greater than the memory cell threshold voltage of the programmed target memory cell MC, a current is generated and flows through the target memory cell MC to discharge the second node N2, so that the voltage level of the second node N2 is the low voltage level (for example, the third voltage level corresponding to the digital value "0"). This means that the previous program operation is not completed or not successful, and the program operation is needed to be performed again. On the contrary, if the verify voltage is less than the memory cell threshold voltage of the programmed target memory cell MC, the current is not generated in the target memory cell MC, so that the voltage level of the second node N2 maintains at the pre-charged high voltage level (for example, the fourth voltage level, corresponding to digital value "1"). This means that the previous program operation is completed or successful, and it is not necessary to perform the program operation again.

Referring to FIG. 9 again, during the setting time period Tset, the transmitting control signal FC has a specific bias voltage level FPW. That is, the transmitting transistor MT receives the bias voltage level FPW during the setting time period Tset. Taking the transmitting transistor MT being an N-type metal-oxide semiconductor field transistor for example, the value of the bias voltage level FPW may be, for example, between a threshold voltage of the transmitting transistor MT and twice the threshold voltage of the transmitting transistor MT. Accordingly, when the transmitting transistor MT receives the bias voltage FPW and the voltage level of the first node N1 is the first voltage level (the low voltage level, corresponding to the digital value "0"), no matter the voltage level of the second node N2 (ex. the voltage level of the second node N2 in the end of the sensing verifying time period Tsenv) is the third voltage level (the low voltage level, corresponding to the digital value "0") or the fourth voltage level (the high voltage level, corresponding to the digital value "1"), the transmitting transistor MT makes the voltage level of the second node N2 to be set as the third voltage level. The third voltage level is close to or substantially equal to the first voltage level. On the contrary, when the transmitting transistor MT receives the bias voltage FPW and the voltage level of the first node N1 is the second voltage level (the high voltage level, corresponding to the digital value "1"), the voltage level of the second node N2 is independently of the voltage level of the first node.

For example, when the transmitting transistor MT receives the bias voltage FPW of 1 volt and the voltage level of the first node N1 is the first voltage level (for example, 0 volt), because the voltage difference between the control terminal of the transmitting transistor MT and the first node N1 is greater than the threshold voltage of the transmitting transistor MT, the transmitting transistor MT is turned on. At this time, no matter what the voltage level of the second node N2 is, the voltage level of the second node N2 would be set to a voltage level substantially equal to or close to the voltage level of the first node N1, i.e., 0 volt to or close to 0 volt (if the voltage difference between the drain and source of the transmitting transistor MT is small when the transmitting transistor MT is turned on).

Further, when the transmitting transistor MT receives the bias voltage FPW of 1 volt and the voltage level of the first node N1 is the second voltage level (for example, 5 volt), assuming that the voltage level of the second node N2 is the third voltage level (for example, 0 volt), because the voltage difference between the control terminal of the transmitting transistor MT and the first node N2 is greater than the threshold voltage of the transmitting transistor MT, the transmitting transistor MT is turned on, and the second node N2 is charged by the conducting current of the transmitting transistor MT, so that the voltage level of the second node N2 is risen to about 0.3 volt (i.e. subtract a threshold voltage 0.7 volt from 1 volt). At this time, the voltage level of the second node N2 (0.3 volt) is close to the third voltage of 0 volt, and fails to turn on the sensing transistor MSE.

Further, when the transmitting transistor MT receives the bias voltage FPW of 1 volt and the voltage level of the first node N1 is the second voltage level (for example, 5 volt), assuming that the voltage level of the second node N2 is the fourth voltage level (for example, 5 volt), because the voltage levels of the drain and the source of the transmitting transistor MT are both greater than the voltage level of the control terminal of the transmitting transistor MT, the transmitting transistor MT is turned off to make the voltage level of the second node N2 to maintain at the fourth voltage level.

In short, when the transmitting transistor MT receives the bias voltage level FPW, the transmitting transistor MT transmits the first voltage level (corresponding to the low voltage level or the digital value "0") of the first node N1 to the second node N2, but does not transmits the second voltage level (corresponding to the high voltage level or the digital value "1") of the first node N1 to the second node N2 (so that the voltage level of the second node N2 is independently of the voltage level of the first node N1).

In another example, assuming that the transmitting transistor MT is an P-type metal-oxide semiconductor field transistor, the value of the bias voltage level FPW is between a first voltage level and a second voltage level, the first voltage level is a voltage of subtracting a threshold voltage from a high voltage source level and the second voltage level is a voltage of subtracting twice the threshold voltage from the high voltage source level.

In the present embodiment, during the setting time period Tset, when a set of storing data (for example, "11" "10," "00" or "01") corresponding to the first data voltage and the second data voltage stored in the first data driving circuit 202 and the second data driving circuit 206 is consistent with the verify data (for example, "11," "10", "00, "or "01") corresponding to the verify voltage, the voltage level of the first node N1 is set to be the second voltage level (the high voltage level, corresponding to the digital value "1"), so that the voltage level of the second node N2 is independently of the voltage level of the first node N1 and maintains at a voltage level close to or substantially equal to its original voltage level (possibly to be the third voltage level or the fourth voltage level). On the contrary, when a set of storing data corresponding to the first data voltage and the second data voltage is not consistent with the verify data corresponding to the verify voltage, the voltage level of the first node N1 is set to be the first voltage level (the low voltage level, corresponding to the digital value "0"), so that the voltage level of the second node N2 is set to be as the third level (the low voltage level, corresponding to the digital value "0").

Figure 12:
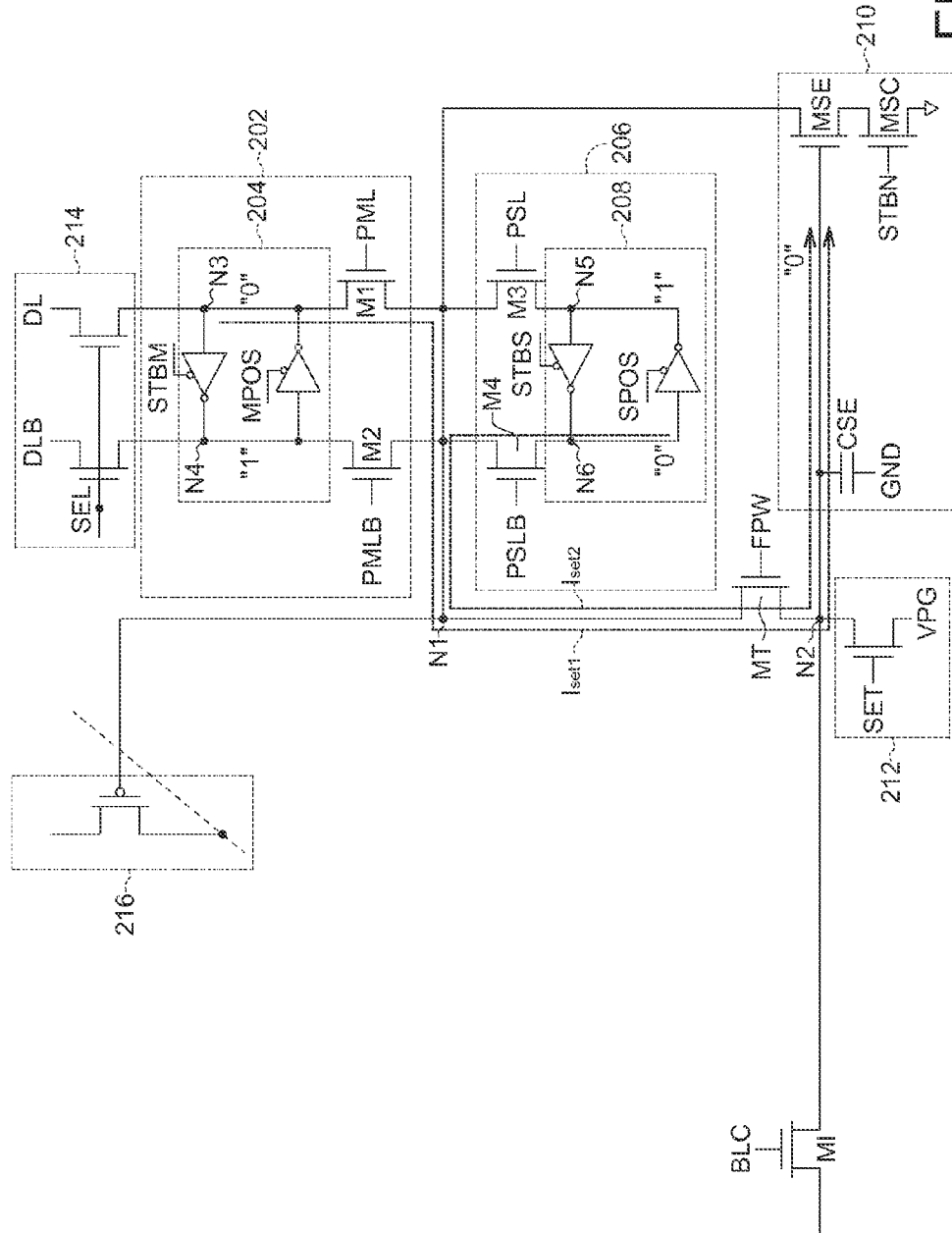
FIG. 12 shows the situation that when the verify voltage is the voltage PV1, and a set of storing data corresponding to the first data voltage and the second data voltage is not consistent with the verify data corresponding to the verify voltage.

Referring to FIG. 12, the situation that when the verify voltage is the voltage PV1, and a set of storing data corresponding to the first data voltage and the second data voltage is not consistent with the verify data corresponding to the verify voltage is shown.

As shown in FIG. 12, assuming that the first data voltage (the voltage of the third node N3) and the second data voltage (the voltage of the fifth node N5) are corresponding to the digital values "0" and "1," respectively. That is, the set of storing data corresponding to the first data voltage and the second data voltage is the 2-bit data "01". Assuming that the currently used verify voltage is the voltage PV1. Because the verify data corresponding to the verify voltage (PV1) is the digital value "10" (with the verity voltage PV1, the content stored in the target memory cell MC is going to be verified whether the digital value "10" is stored in the memory cell MC), it can be obtained that in such situation, the set of storing data corresponding to the first data voltage and the second data voltage ("01") is not consistent with the verify data "10". At this time, the first data driving circuit 202 and the second data driving circuit 206 output the first data voltage (corresponding the digital value "0") and the inverse second data voltage (corresponding the digital value "0") to the first node N1 through the setting current paths Iset1 and Iset2, respectively, so that the voltage level of the first node N1 is the first voltage level (the low voltage level, corresponding to the digital value "0"), thereby the voltage level of the second node N2 is set to be as the third level (the low voltage level, corresponding to the digital value "0") close to or substantially equal to the first voltage level.

Figure 13:
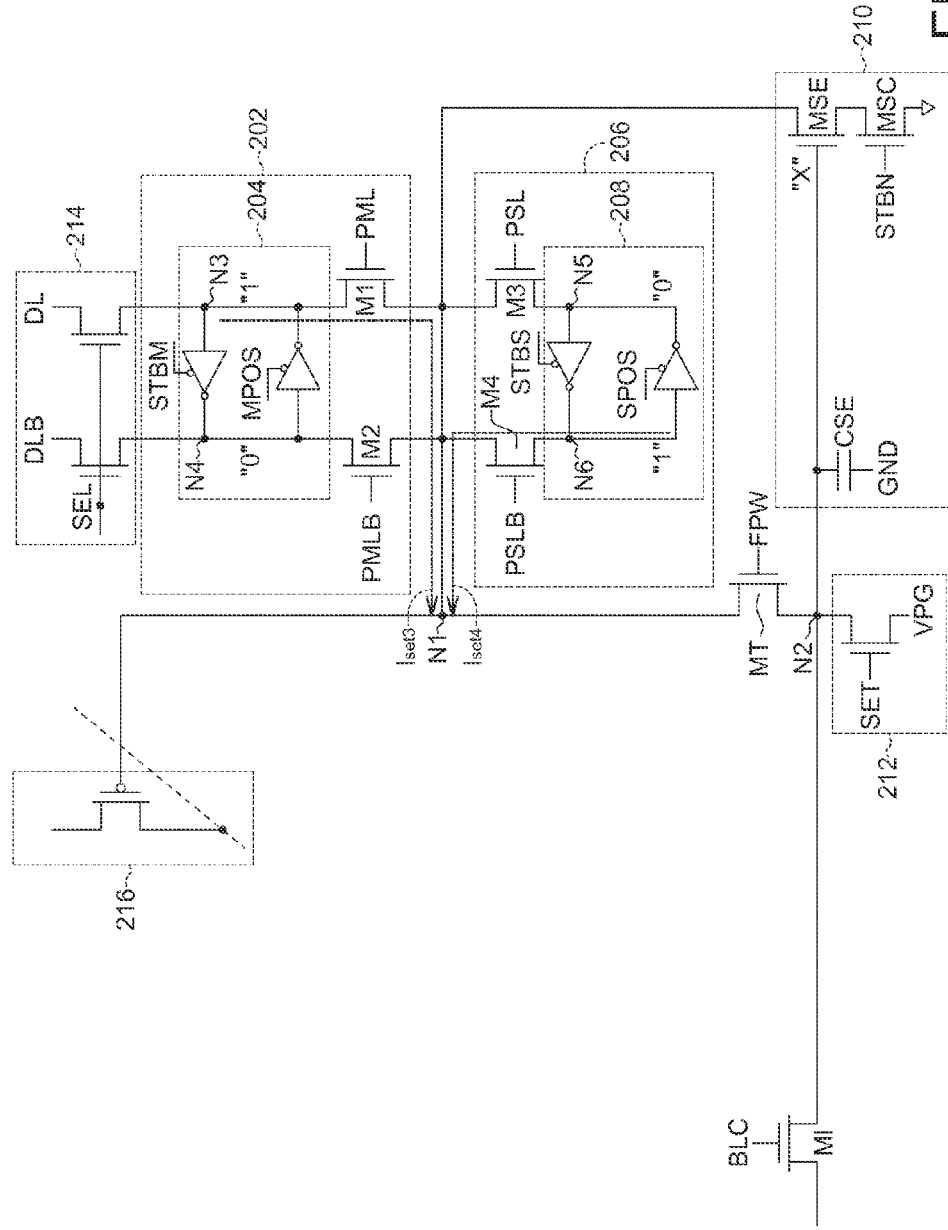
FIG. 13 shows the situation that when the verify voltage is the voltage PV1, and a set of storing data corresponding to the first data voltage and the second data voltage is consistent with the verify data corresponding to the verify voltage.

Referring to FIG. 13, the situation that when the verify voltage is the voltage PV1, and a set of storing data corresponding to the first data voltage and the second data voltage is consistent with the verify data corresponding to the verify voltage is shown. As shown in FIG. 13, assuming that the first data voltage (the voltage of the third node N3) and the second data voltage (the voltage of the fifth node N5) are corresponding to the digital values "1" and "0," respectively. That is, the set of storing data corresponding to the first data voltage and the second data voltage is the 2-bit data "10". Assuming that the currently used verify voltage is the voltage PV1. In such situation, the set of storing data corresponding to the first data voltage and the second data voltage ("10") is consistent with the verify data "10" corresponding to the verify voltage (PV1). At this time, the first data driving circuit 202 and the second data driving circuit 206 output the first data voltage (corresponding the digital value "1") and the inverse second data voltage (corresponding the digital value "1") to the first node N1 through the setting current paths Iset3 and Iset4, respectively, so that the voltage level of the second node N2 is close to or substantially equal to its original voltage level (possibly to be the third voltage level or the fourth voltage level, denoted as X in FIG. 13).

In the present embodiment, if the memory cell threshold voltage is greater than the verify voltage, there is no current flows through the target memory cell MC during the verification, so that the voltage level of the second node N2 is corresponding to the digital value "1". This means that the program operation for the target memory cell MC is successful and not needed to be performed again. On the contrary, if the memory cell threshold voltage is less than the verify voltage, a current is generated and flows through the target memory cell MC during the verification, so that the voltage level of the second node N2 is corresponding to the digital value "0". This means that the program operation for the target memory cell MC is failed and needed to be performed again. However, when the voltage level of the second node N2 is corresponding to the digital value "1", it does not necessarily represent that the data is correctly written into target memory cell MC. For example, referring to FIG. 11, assuming that the target memory cell MC is originally intended to be programmed to be corresponding to data "10", but it is programmed to be corresponding to data "00" (over programmed and failed). At this time, if the program verify operation for the target memory cell MC is performed with a verify voltage having the voltage level PV1, because there is no current generated to discharge the second node N2 (the voltage level of the gate of the target memory cell MC is less than the memory cell threshold voltage), the voltage level of the second node N2 still maintains at the pre-charged high voltage level (corresponding to the digital value "1"), and resulting in misjudgment of successful program operation. Thus, with the transmitting transistor MT receiving the specific bias voltage level, the integrated circuit 200 of the present embodiment is capable of setting the voltage level of the second node N2 according to the first voltage level (corresponding to the digital value "0") of the first node N1 when the set of storing data corresponding to the first data voltage and the second data voltage is not consistent with the verify data corresponding to the verify voltage, so that the voltage level of the second node N2 is set to be close to or substantially equal to the first voltage level (corresponding to the digital value "0", representing that the program operation is needed to be performed again), thereby the occurrence of the error or misjudgment mentioned above can be effectively avoided with simple circuit control procedure.

In this embodiment, the verify voltage being the voltage PV1 is taken as an example, and this embodiment is also applicable to the situations of the verify voltage being the voltage PV1 or PV3. Similarly, this embodiment is also applicable to the situations of the first data voltage and the second data voltage being corresponding to the 2-bit data "11", "00", and "01."

Next, during the reading verifying time period Tstrv, the integrated circuit 200 selectively changes the first data voltage or the second data voltage according to the voltage level of the second node N2 to determine whether to keep on the program operation for the target memory cell MC.

Erase Operation

Figure 14:
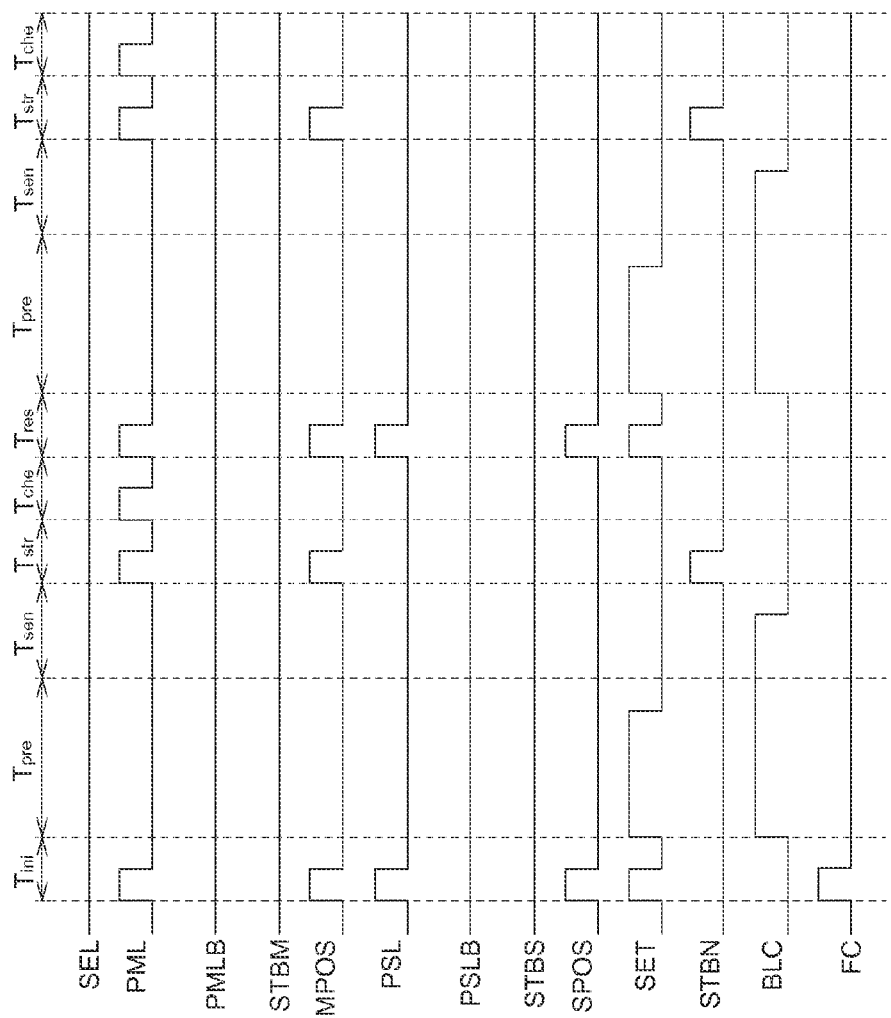
FIG. 14 shows a signal waveform in the erase operation of the integrated circuit.

FIG. 14 shows a signal waveform in the erase operation of the integrated circuit 200. As shown in FIG. 14, the integrated circuit 200 firstly performs the reading operation (including an initializing time period Tini, a pre-charging time period Tpre, a sensing time period Tsen and a reading time period Tstr) for the target memory cell MC, and stores the data stored in the target memory cell MC in the third node N3 to be taken as the first data voltage. Then, during the checking time period Tche, the first transistor M1 is enabled, so that the first data driving circuit 202 outputs the first data voltage of the third node N3 to the first node N1. Next, during the erasing time period Tres, the erasing circuit 216 determines whether to perform the erase operation for the target memory cell MC according to the voltage level of the first node N1. For example, the erasing circuit 216 includes a P-type transistor, and the gate of the P-type transistor is coupled to the first node N1. When the voltage level of the first node N1 is the low voltage level (for example, the first voltage level, corresponding to the digital value "0"), the P-type transistor is turned on. At this time, the erasing circuit 216 makes the memory cell threshold voltage of the target memory cell MC to be set as corresponding to data "11" to erase the content stored in the target memory cell MC. In other words, for the target memory cell MC of which the memory cell threshold voltage has been programmed in the voltage interval corresponding to data "10", "00", or "01", the integrated circuit 200 is capable of restoring the memory cell threshold voltage of the target memory cell MC to be in the voltage interval corresponding to data "11". The present invention is not limited to the above example. The erasing circuit 216 may also be implemented as other types of memory erasing circuits.

Figure 15:
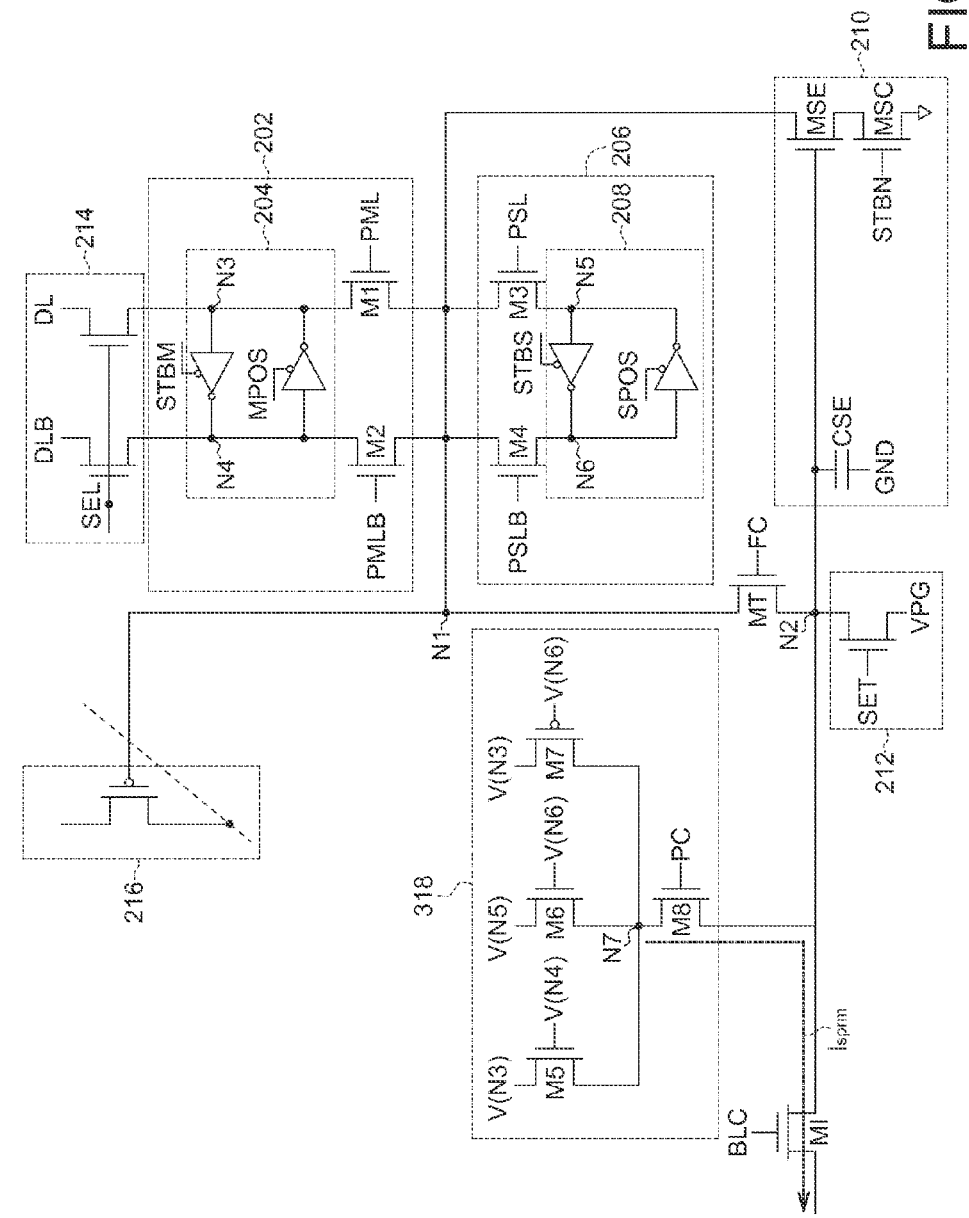
FIG. 15 shows a circuit diagram of the integrated circuit according to another embodiment of the invention.

Referring to FIG. 15, a circuit diagram of the integrated circuit 300 according to another embodiment of the invention is shown. The main difference between this embodiment and the previous embodiment relies in that the integrated circuit 300 further includes a program circuit 318. The program circuit 318 includes a fifth transistor M5, a sixth transistor M6, a seventh transistor M7 and a eighth transistor M8. The fifth transistor M5 has a first terminal, a second terminal and a third terminal. The first terminal of the fifth transistor M5 receives the first data voltage (denoted as V(N3) in FIG. 15), the second terminal of the fifth transistor M5 is coupled to a seventh node N7, and the third terminal of the fifth transistor M5 receives the inverse first data voltage (denoted as V(N4) in FIG. 15). The sixth transistor M6 has a first terminal, a second terminal and a third terminal. The first terminal of the sixth transistor M6 receives the second data voltage (denoted as V(N5) in FIG. 15), the second terminal of the sixth transistor M6 is coupled to the seventh node N7, and the third terminal of the sixth transistor receives the inverse second data voltage (denoted as V(N6) in FIG. 15). The seventh transistor M7 has a first terminal, a second terminal and a third terminal. The first terminal of the seventh transistor M7 receives the first data voltage (denoted as V(N3) in FIG. 15), the second terminal of the seventh transistor is coupled to the seventh node N7, and the third terminal of the seventh transistor M7 receives the inverse second data voltage (denoted as V(N6) in FIG. 15). The eighth transistor M8 has a first terminal, a second terminal and a third terminal receiving a program control signal PC. The first terminal of the eighth transistor M8 and the second terminal of the eighth transistor M8 are coupled to the seventh node N7 and the second node N2, respectively.

An operating method of an integrated circuit is further provided according to the embodiments of the present invention. The operating method includes the following steps. First, providing an integrated circuit. The integrated circuit includes a first data driving circuit and a transmitting transistor. The first data driving circuit, coupled to a first node, is for outputting a first data voltage to the first node. The voltage level of the first node includes a first voltage level and a second voltage level. The transmitting transistor is coupled between the first node and a second node. A voltage level of the second node is a third voltage level or a fourth voltage level. Then, when the transmitting transistor receives a bias voltage and the voltage level of the first node is the first voltage level, the voltage level of the second node is set to be the third voltage level by the transmitting transistor. When the transmitting transistor receives the bias voltage and the voltage level of the first node is the second voltage level, the voltage level of the second node is independently of the voltage level of the first node.

Based on the above, when the transmitting transistor of the integrated circuit according to the present invention receives the bias voltage level, only a specific digital value in one node can be passed through the transmitting transistor to the other node. By applying the characteristic to the program verify operation of the integrated circuit, misjudgment of verification can be simply and effectively avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An integrated circuit of a memory, comprising:
   a first data driving circuit, coupled to a first node, for outputting a first data voltage to the first node, wherein the voltage level of the first node is a first voltage level or a second voltage level;
   a transmitting transistor coupled between the first node and a second node, wherein a voltage level of the second node is a third voltage level or a fourth voltage level; and
   a sensing circuit controlled by the voltage level of the second node and coupled to the second node;
   wherein when the transmitting transistor receives a bias voltage and the voltage level of the first node is the first voltage level, the transmitting transistor makes the voltage level of the second node to be set as the third voltage level, the third voltage level and the first voltage level are corresponding to a same logic state; when the transmitting transistor receives the bias voltage and the voltage level of the first node is the second voltage level, the voltage level of the second node is independent of the voltage level of the first node, and the transmitting transistor blocks transfer of the first data voltage from the first data driving circuit to the second node; when the voltage level of the second node is the fourth voltage level, the sensing circuit generates a current path so that the voltage level of the first node is set to be the first voltage level, and when the voltage level of the second node is the third voltage level, the sensing circuit interrupts the current path.

2. The integrated circuit according to claim 1, wherein the first data driving circuit comprises:
   a first latch, for storing the first data voltage in a third node, and storing an inverse first data voltage in a fourth node;
   a first transistor having a first terminal, a second terminal and a third terminal receiving a first control signal, wherein the first terminal of the first transistor and the second terminal of the first transistor are coupled to the third node and the first node, respectively, and when the first control signal is enabled, the first data voltage stored in the third node is outputted to the first node; and
   a second transistor having a first terminal, a second terminal and a third terminal receiving a second control signal, wherein the first terminal of the second transistor and the second terminal of the second transistor are coupled to the fourth node and the first node, respectively, and when the second control signal is enabled, the inverse first data voltage stored in the fourth node is outputted to the first node.

3. The integrated circuit according to claim 1, further comprising:

a second data driving circuit, coupled to the first node, for outputting a second data voltage to the first node.

4. The integrated circuit according to claim 3, wherein the second data driving circuit comprises:
   a second latch, for storing the second data voltage in a fifth node, and storing an inverse second data voltage in a sixth node;
   a third transistor having a first terminal, a second terminal and a third terminal receiving a third control signal, wherein the first terminal of the third transistor and the second terminal of the third transistor are coupled to the fifth node and the first node, respectively, and when the third control signal is enabled, the second data voltage stored in the fifth node is outputted to the first node; and
   a fourth transistor having a first terminal, a second terminal and a third terminal receiving a fourth control signal, wherein the first terminal of the fourth transistor and the second terminal of the fourth transistor are coupled to the sixth node and the first node, respectively, and when the fourth control signal is enabled, the inverse second data voltage stored in the sixth node is outputted to the first node.

5. The integrated circuit according to claim 3, further comprising:
   a program circuit, comprising:
   a fifth transistor having a first terminal, a second terminal and a third terminal, wherein the first terminal of the fifth transistor receives the first data voltage, the second terminal of the fifth transistor is coupled to a seventh node, and the third terminal of the fifth transistor receives the inverse first data voltage;
   a sixth transistor having a first terminal, a second terminal and a third terminal, wherein the first terminal of the sixth transistor receives the second data voltage, the second terminal of the sixth transistor is coupled to the seventh node, and the third terminal of the sixth transistor receives the inverse second data voltage;
   a seventh transistor having a first terminal, a second terminal and a third terminal, wherein the first terminal of the seventh transistor receives the first data voltage, the second terminal of the seventh transistor is coupled to the seventh node, and the third terminal of the seventh transistor receives the inverse second data voltage; and
   a eighth transistor having a first terminal, a second terminal and a third terminal receiving a program control signal, wherein the first terminal of the eighth transistor and the second terminal of the eighth transistor are coupled to the seventh node and the second node, respectively.

6. The integrated circuit according to claim 3, wherein in a setting time period of a program verify operation, the transmitting transistor receives the bias voltage, a target memory cell receives a verify voltage and selectively discharges the second node, the target memory cell is coupled to the second node through a bit line;
   wherein the verify voltage is corresponding to a verify data, when a set of storing data corresponding to the first data voltage and the second data voltage stored in the first data driving circuit and the second data driving circuit is consistent with the verify data corresponding to the verify voltage, the voltage level of the first node is set to be the second voltage level;
   wherein when the set of storing data corresponding to the first data voltage and the second data voltage is not consistent with the verify data corresponding to the verify voltage, the voltage level of the first node is set to be the first voltage level.

7. The integrated circuit according to claim 6, wherein when the second node is discharged, the voltage level of the second node is the third voltage level, when the second node is charged, the voltage level of the second node is the fourth voltage level.

8. The integrated circuit according to claim 7, wherein the first voltage level and the third voltage level correspond to a first digital value, and the second voltage level and the forth level correspond to a second digital value.

9. The integrated circuit according to claim 1, wherein the transmitting transistor is an N-type metal-oxide semiconductor field transistor.

10. The integrated circuit according to claim 9, wherein the value of the bias voltage is between a threshold voltage of the transmitting transistor and twice the threshold voltage of the transmitting transistor.

11. The integrated circuit according to claim 1, wherein the transmitting transistor is a P-type metal-oxide semiconductor field transistor.

12. An integrated circuit of a memory, comprising:
a first data driving circuit, coupled to a first node, for outputting a first data voltage to the first node, wherein the logic level of the first node is a first logic level or a second logic level; and
a transmitting transistor coupled between the first node and a second node, wherein a logic level of the second node is a third logic level or a fourth logic level;
wherein when the transmitting transistor receives a bias voltage and the logic level of the first node is the first logic level, the transmitting transistor makes the logic level of the second node to be set as the third logic level, the third logic level is equal to the first logic level, when the transmitting transistor receives the bias voltage and the logic level of the first node is the second logic level, the logic level of the second node is independent of the logic level of the first node, and the transmitting transistor blocks transfer of the first data voltage from the first data driving circuit to the second node;
wherein the integrated circuit further comprises:
a sensing circuit controlled by the logic level of the second node and coupled to the second node;
wherein when the logic level of the second node is the fourth logic level, the sensing circuit generates a current path so that the logic level of the first node is set to be the first logic level, and when the logic level of the second node is the third logic level, the sensing circuit interrupts the current path.

13. A operating method of an integrated circuit comprising:
providing an integrated circuit, wherein the integrated circuit comprises a first data driving circuit and a transmitting transistor, the first data driving circuit, coupled to a first node, outputs a first data voltage to the first node, the voltage level of the first node is a first voltage level or a second voltage level, the transmitting transistor is coupled between the first node and a second node, a voltage level of the second node is a third voltage level or a fourth voltage level;
when the transmitting transistor receives a bias voltage and the voltage level of the first node is the first voltage level, setting the voltage level of the second node to be the third voltage level by the transmitting transistor; and
when the transmitting transistor receives the bias voltage and the voltage level of the first node is the second voltage level, making the voltage level of the second node to be independent of the voltage level of the first node, and blocking transfer of the first data voltage from the first data driving circuit to the second node;
wherein the integrated circuit further comprises a sensing circuit, the sensing circuit is controlled by the voltage level of the second node and coupled to the second node, the method further comprises:
when the voltage level of the second node is the fourth voltage level, generating a current path to set the voltage level of the first node to be the first voltage level by the sensing circuit; and
when the voltage level of the second node is the third voltage level, interrupting the current path by the sensing circuit.

14. The operating method according to claim 13, wherein the integrated circuit further comprises a second data driving circuit, the second data driving circuit is coupled to the first node, the method further comprises:
outputting a second data voltage to the first node by the second data driving circuit.

15. The operating method according to claim 14, wherein the second node is coupled to a target memory cell through a bit line, the method further comprises:
in a setting time period of a program verify operation, providing the bias voltage to the transmitting transistor, and providing a verify voltage to the target memory cell to selectively discharge the second node;
wherein the verify voltage is corresponding to a verify data, when a set of storing data corresponding to the first data voltage and the second data voltage stored in the first data driving circuit and the second data driving circuit is consistent with the verify data corresponding to the verify voltage, setting the voltage level of the first node to be the second voltage level;
wherein when the set of storing data corresponding to the first data voltage and the second data voltage is not consistent with the verify data corresponding to the verify voltage, the voltage level of the first node is set to be the first voltage level.

16. The operating method according to claim 15, wherein when the second node is discharged, the voltage level of the second node is the third voltage level, when the second node is charged, the voltage level of the second node is the fourth voltage level.

17. The operating method according to claim 13, wherein the transmitting transistor is an N-type metal-oxide semiconductor field transistor.

18. The operating method according to claim 17, wherein the value of the bias voltage is between a threshold voltage of the transmitting transistor and twice the threshold voltage of the transmitting transistor.

* * * * *